(12) United States Patent
Carullo (10) Patent No.: US 10,139,543 B2
(45) Date of Patent: Nov. 27, 2018

(54) LIGHT PIPE ARRAY ASSEMBLY FOR A BLADE SERVER

(71) Applicant: NetScout Systems, Inc., Westford, MA (US)

(72) Inventor: Thomas J. Carullo, Marlton, NJ (US)

(73) Assignee: NetScout Systems, Inc., Westford, MA (US)

(*) Notice: Subject to any disclaimer, the term of this patent is extended or adjusted under 35 U.S.C. 154(b) by 254 days.

(21) Appl. No.: 15/178,874

(22) Filed: Jun. 10, 2016

(65) Prior Publication Data

US 2017/0357045 A1 Dec. 14, 2017

(51) Int. Cl.
*G01D 11/28* (2006.01)
*F21V 8/00* (2006.01)
*H05K 7/14* (2006.01)

(52) U.S. Cl.
CPC ......... *G02B 6/0008* (2013.01); *G02B 6/0006* (2013.01); *H05K 7/1487* (2013.01)

(58) Field of Classification Search
CPC ... G02B 6/0008; G02B 6/0006; H05K 7/1487
USPC ...................................................... 362/23.17
See application file for complete search history.

(56) References Cited

U.S. PATENT DOCUMENTS

| 5,327,328 A | 7/1994 | Simms et al. |
| 5,988,842 A * | 11/1999 | Johnsen ............... G02B 6/0008 200/314 |
| 6,463,204 B1 | 10/2002 | Ati |
| 7,891,855 B2 | 2/2011 | Yang |
| 2012/0039562 A1 * | 2/2012 | Tan ....................... G02B 6/325 385/14 |

* cited by examiner

*Primary Examiner* — Bao Q Truong
*Assistant Examiner* — Meghan Ulanday
(74) *Attorney, Agent, or Firm* — Locke Lord LLP; Scott D. Wofsy; Christopher J. Capelli (57) ABSTRACT

A light pipe array assembly is disclosed which includes an opaque carrier having an elongated planar platform defining upper and lower horizontal surfaces and a longitudinal axis, a first set of light pipes supported on the upper surface of the platform and arranged perpendicular to the longitudinal axis of the platform, and a second set of light pipes supported on the lower surface of the platform and arranged perpendicular to the longitudinal axis of the platform in alignment with the first set of light pipes, wherein the first and second sets of light pipes are optically isolated from each other by the platform of the carrier.

24 Claims, 9 Drawing Sheets

LIGHT PIPE ARRAY ASSEMBLY FOR A BLADE SERVER

BACKGROUND OF THE INVENTION

1. Field of the Invention

The subject invention is directed to a light pipe array, and more particularly, to a light pipe array assembly adapted for direct mounting to a printed circuit board in a blade server housing to transport light from a series of surface mounted light emitting diodes on the printed circuit board to a corresponding visual display on the front panel of the blade server housing.

2. Description of Related Art

A light pipe transfers light from one place to another. To accomplish this, the light pipe receives light at one end and internally reflects the light to its other end. Thus, the light pipe provides a channel for transporting the light from an input to an output. A light pipe may contain curves as long as the critical angle of the material, such as plastic or glass, is not exceeded.

Light pipes are commonly used for transferring light from a surface mounted light-emitting diode (LED) on a printed circuit board (PCB) to a visual display on an electronic device, as disclosed for example in U.S. Pat. No. 5,327,328 to Simms et al. They are often ganged and stacked together in closely spaced arrays to maximize the use of available space on the printed circuit board and the display panel of the device housing. However, these closely packed arrays can result in bleed-over or optical cross-talk between adjacent light pipes, causing confusion as to which LED is actually being presented on the visual display.

This issue can be exacerbated when individual light pipes in an array are attached to one another by cross-member features, as disclosed for example in U.S. Pat. No. 6,463,204 to Ati. Moreover, because area available on the display panel is rather confined, the connected light pipe members are often very close together, so the distance light travels through the cross-members is very small, which greatly increases the likelihood and intensity of an erroneous signal on the display panel.

It would be beneficial to provide a light pipe array assembly that maximizes the available space on a printed circuit board and on the visual display and which does not require cross-members between adjacent light pipes, so as to prevent optical cross-stalk and bleed-over between adjacent light pipes. The subject invention provides a solution by effectively eliminating the optical path between adjacent light pipes in an array by optically isolating adjacent light pipes in the array through vertical and/or horizontal separation.

SUMMARY OF THE INVENTION

The subject invention is directed to a new and useful light pipe array assembly designed to prevent optical cross-talk between vertically and horizontally adjacent light pipes in a bi-level light pipe array assembly. The assembly includes a carrier having an elongated planar platform defining upper and lower horizontal surfaces and a longitudinal axis. A first set of light pipes is supported on the upper surface of the platform and they are arranged perpendicular to the longitudinal axis of the platform. A second set of light pipes is supported on the lower surface of the platform and they are arranged perpendicular to the longitudinal axis of the platform in alignment with the first set of light pipes.

The carrier is preferably constructed from an opaque plastic material which optically isolates the first set of light pipes from the second set of light pipes. The carrier includes legs that depend from the lower surface of the platform for mounting the light pipe array assembly to a supporting structure. Preferably, each light pipe is formed from a clear plastic material in an injection molding process. Each light pipe in the assembly includes a central body portion, a proximal end portion for communicating with a light source on the supporting structure and a distal end portion for communicating with a visual display remote from the light source.

The proximal end portion of each light pipe in the first set of light pipes includes a horizontal light receiving surface for communicating with a light source, and the proximal end of each light pipe in the second set of light pipes includes a vertical light receiving surface for communicating with a light source. The platform includes a plurality of spaced apart mounting apertures in the upper and lower surfaces thereof for receiving mounting posts depending from the central body portion of each light pipe.

In an embodiment of the invention, the platform of the opaque carrier includes a first planar level associated with the central body portion and the proximal end portion of each light pipe, and a second planar level associated with the distal end portion of each light pipe. In addition, each light pipe is positioned between a pair of upstanding walls that are formed integral with the platform of the carrier. These walls function to optically isolate horizontally adjacent light pipes from one another to further prevent optical cross-talk there between.

The subject invention is also directed to a light pipe array assembly mounted to a printed circuit board, which includes an opaque carrier having an elongated planar platform defining upper and lower horizontal surfaces and a longitudinal axis, and including legs depending from the lower surface of the platform for mounting the light pipe array assembly to the printed circuit board. A first set of clear plastic light pipes is supported on the upper surface of the platform and they are arranged perpendicular to the longitudinal axis of the platform to communicate with a first set of light sources on the printed circuit board. A second set of clear plastic light pipes is supported on the lower surface of the platform and they are arranged perpendicular to the longitudinal axis of the platform in alignment with the first set of light pipes to communicate with a second set of light sources on the printed circuit board.

The subject invention is also directed to a light pipe array assembly mounted to a printed circuit board in a blade server housing, which includes an opaque carrier having an elongated planar platform defining upper and lower horizontal surfaces and a longitudinal axis, and including legs depending from the lower surface of the platform for mounting the light pipe array assembly to the printed circuit board. A first set of clear plastic light pipes is supported on the upper surface of the platform and they are arranged perpendicular to the longitudinal axis of the platform to transport light from a first set of light sources on the printed circuit board to a first set of ports on a front display panel of the blade server housing. A second set of clear plastic light pipes is supported on the lower surface of the platform and they are arranged perpendicular to the longitudinal axis of the platform in alignment with the first set of light pipes to transport light from a second set of light sources on the printed circuit board to a second set of ports on the front display panel of the blade server housing.

These and other features of the light pipe array assembly of the subject invention and the manner in which it is manufactured and employed in a blade server housing will become more readily apparent to those having ordinary skill in the art from the following enabling description of the preferred embodiments of the subject invention taken in conjunction with the several drawings described below.

BRIEF DESCRIPTION OF THE DRAWINGS

So that those skilled in the art to which the subject invention relates will readily understand how to make and use the light pipe array assembly of the subject invention without undue experimentation, embodiments thereof will be described in detail herein below with reference to certain figures, wherein.

DETAILED DESCRIPTION OF THE PREFERRED EMBODIMENTS

Figure 1:
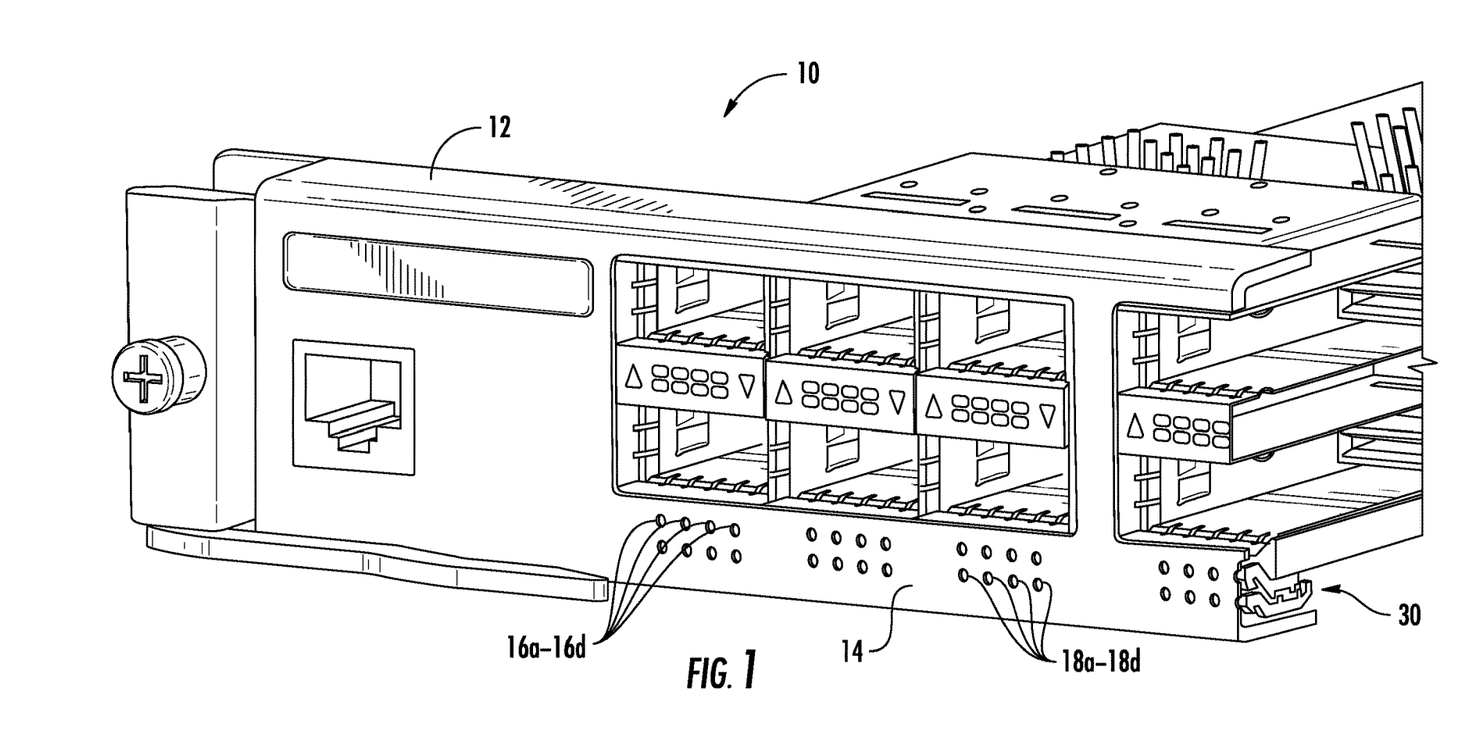
FIG. 1 is a perspective view of a blade server housing that contain a printed circuit board with the light pipe array assembly of the subject invention mounted thereon.
Figure 2:
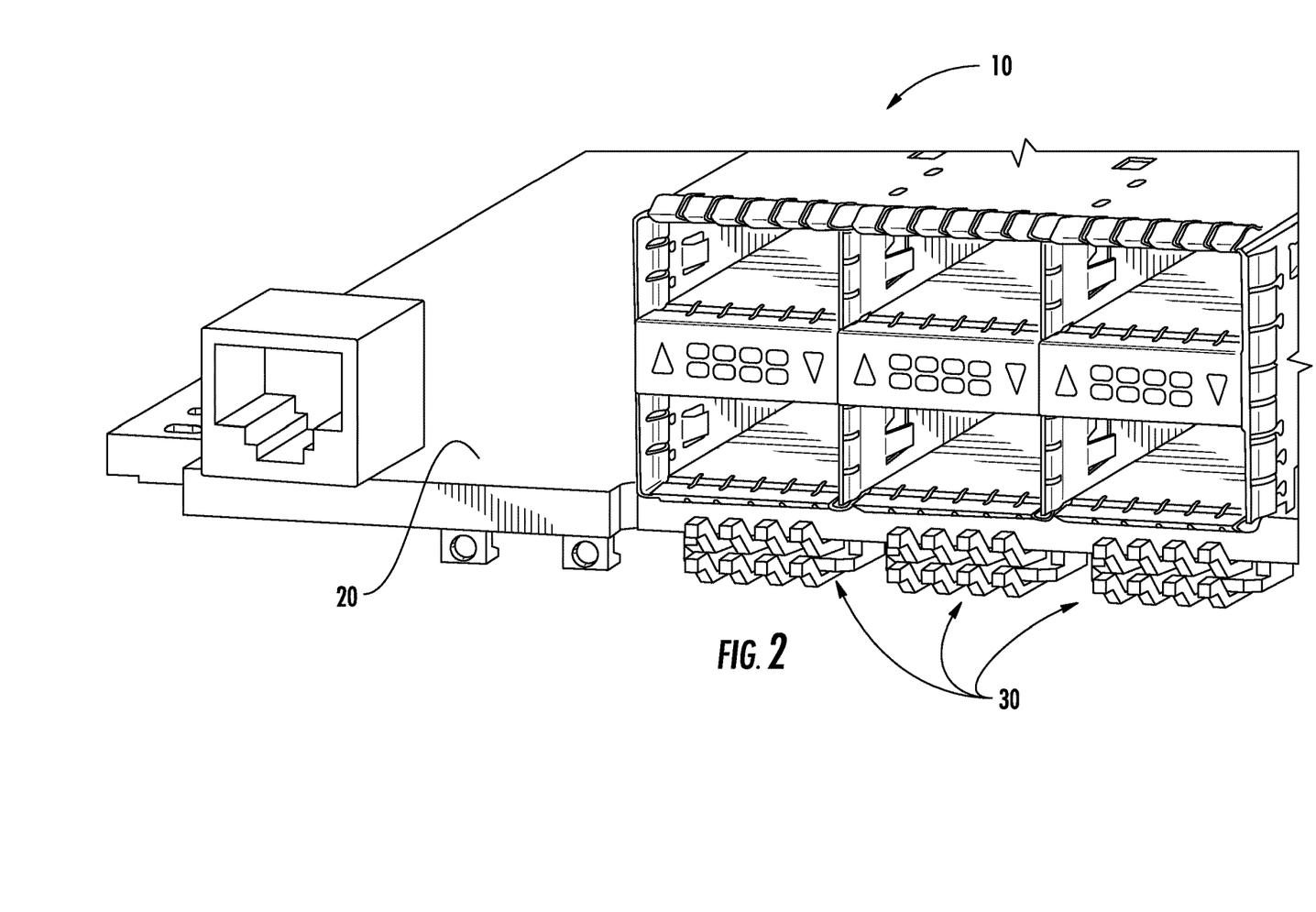
FIG. 2 is a perspective view of the blade server housing shown in FIG. 1 with the front display panel removed to reveal three light pipe array assemblies constructed in accordance with the subject invention.

Referring now to the drawings, wherein like reference numerals identify similar structural features or aspects of the subject invention, there is illustrated in FIGS. 1 and 2 a blade server 10 having a housing 12 that contains a printed circuit board 20 to which is mounted the light pipe array assembly 30 of the subject invention. More particularly, as best seen in FIG. 1, the blade server housing 12 includes a front display panel 14 having a plurality of display port arrays, each including a first set of four display ports 16a-16d on an upper level of the array and a second set of four display ports 18a-18d on the lower level of the array.

In FIG. 2, the front display panel 14 of the blade server housing 12 is removed for ease of illustration, to reveal three light pipe array assemblies, each designated generally by reference numeral 30. It can be readily appreciated by comparing FIGS. 1 and 2 that the stacked array of light pipes in each assembly 30 on printed circuit board 20 align with a corresponding array of indicator display ports in the front display panel 14 of blade server housing 12.

Figure 3:
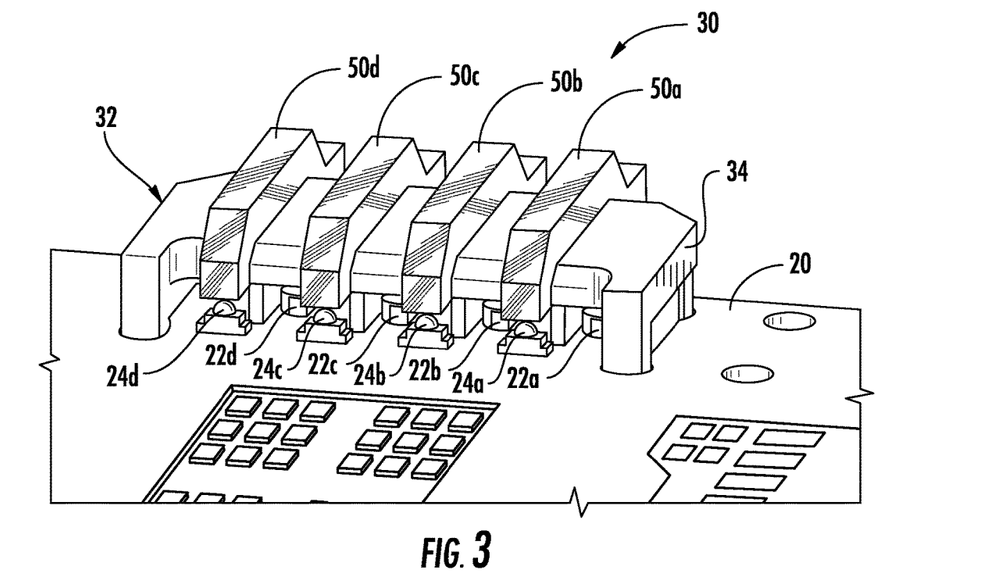
FIG. 3 is a localized perspective view of a first embodiment of the light pipe array assembly of the subject invention mounted on a printed circuit board.
Figure 4:
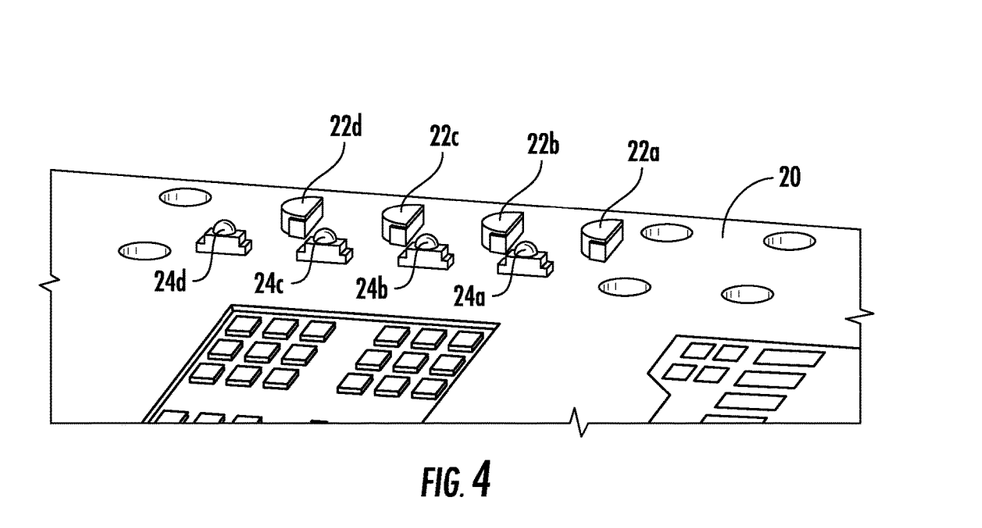
FIG. 4 is a localized perspective view of the printed circuit board shown in FIG. 3, illustrating first and second sets of light emitting diodes.

Referring now to FIG. 3, there is illustrated a localized perspective view of the light pipe array assembly 30 of the subject invention mounted on printed circuit board 20 adjacent first and second sets of circuit board indicators in the form of light emitting diodes (LEDs). More particularly, as shown in FIG. 4, the printed circuit board 20 includes plural arrays of light emitting diodes, each array including a first set of light emitting diodes 22a-22d and a second set of light emitting diodes 24a-24d.

The first set of LEDs 22a-22d have a horizontal orientation aligned with the plane of the printed circuit board 20, whereas the second set of LEDs 24a-24d have a vertical orientation, extending perpendicularly upward from the plane of the printed circuit board 20. As explained in further detail below, the light pipes in the array assembly 30 are configured to interact with both types of LEDs. Furthermore, those skilled in the art will readily appreciate that the color, size and/or shape of the LEDs can vary depending upon the application of use with departing from the sprit or scope of the subject disclosure.

Figure 5:
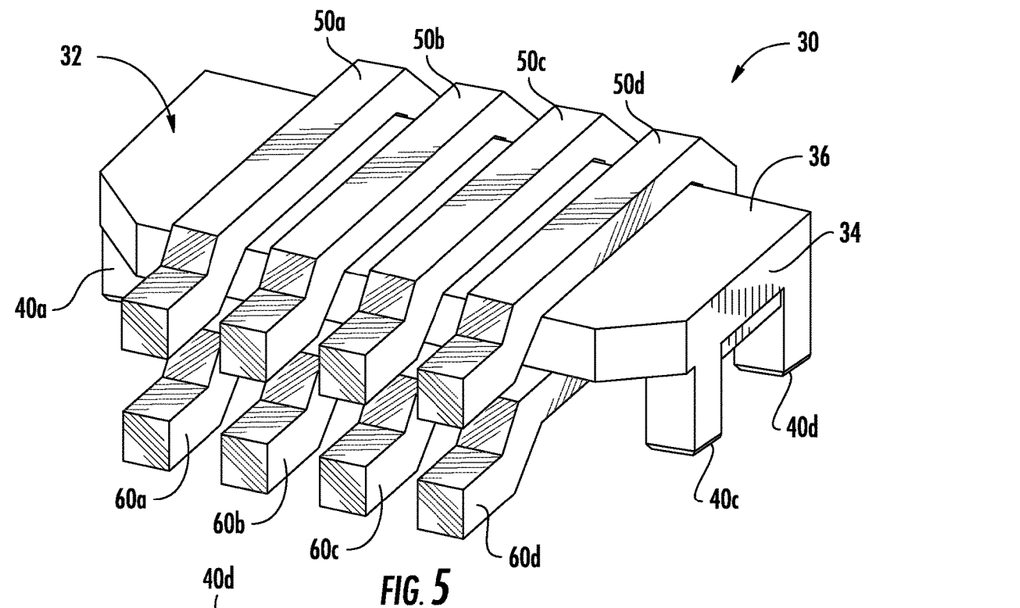
FIG. 5 is a perspective view of the first embodiment of the light pipe array assembly of the subject invention in an upright orientation to illustrate the arrangement of the first set of light pipes on the upper surface of the carrier platform.
Figure 6:
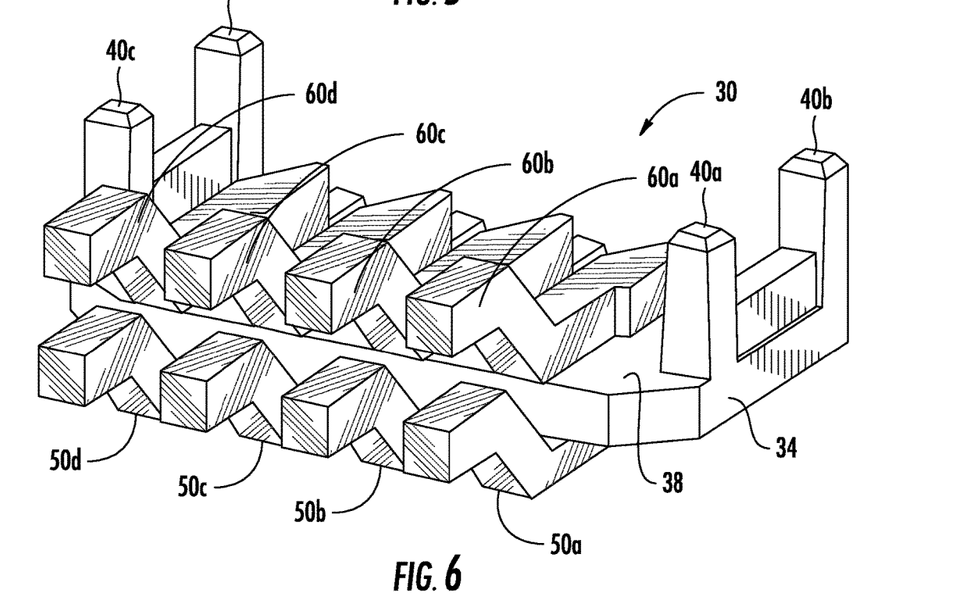
FIG. 6 is a perspective view of the first embodiment of the light pipe array assembly of the subject invention in an inverted orientation to illustrate the arrangement of the second set of light pipes on the lower surface of the carrier platform.

Referring now to FIGS. 5 and 6, each light pipe array assembly 30 of the subject invention includes a carrier 32. The carrier 32 includes an elongated planar platform 34 defining upper and lower horizontal surfaces 36 and 38, and a longitudinal axis. Four legs 40a-40d depend from the lower surface 38 of the platform 34 for mounting the light pipe array assembly 30 to the printed circuit board 20, as illustrated in FIG. 3.

The carrier 32 of light pipe array assembly 30 is constructed from an opaque plastic material, which serves, at least in part, to optically isolate vertically adjacent light pipes from one another. Moreover, there is no clear optical path between vertically adjacent light pipes. Furthermore, the carrier 32 provides a distinct advantage over prior art light pipe arrays, wherein the lights pipes are often directly mounted to the printed circuit board, either individually or in groups, adding complexity and cost to the manufacturing and assembly process. Also, the stacked array of light pipes presents a relatively small and compact unit as compared to prior art light pipe assemblies which require far more display panel area and circuit board space.

The light pipe array assembly 30 further includes a first set of light pipes 50a-50d that are supported on the upper surface 36 of the platform 34 and arranged perpendicular to the longitudinal axis of the platform 34 to transport light from the second set of LEDs 24a-24d on the printed circuit board 20 to a lower set of ports 18a-18d on a front display panel 14 of the blade server housing 12. In this regard, it should be appreciated by those skilled in the art that the inverted orientation of the light pipe assembly shown in FIG. 6 corresponds to the orientation of the light pipe assemblies shown in FIGS. 1 and 2.

The light pipe array assembly 30 also includes a second set of light pipes 60a-60d supported on the lower surface 38 of the platform 34. These are arranged perpendicular to the longitudinal axis of the platform 34 in alignment with the first set of light pipes 50a-50d to transport light from the first set of LEDs 22a-22d on the printed circuit board 20 to a second or upper set of ports 16a-16d on the front display panel 14 of the blade server housing 12.

Each light pipe 50a-50d and 60a-60d of array assembly 30 is individually injection molded from a clear plastic material to provide an optical pathway for light traveling from an LED located on the printed circuit board 20 to the display ports on the front panel 14 of blade server housing 12. The ability to individually mold each light pipe provides a distinct cost advantage over prior art light pipe arrays, wherein adjacent light pipes are often connected to one another by a cross-member, adding to the complexity and cost of manufacture.

Figure 7:
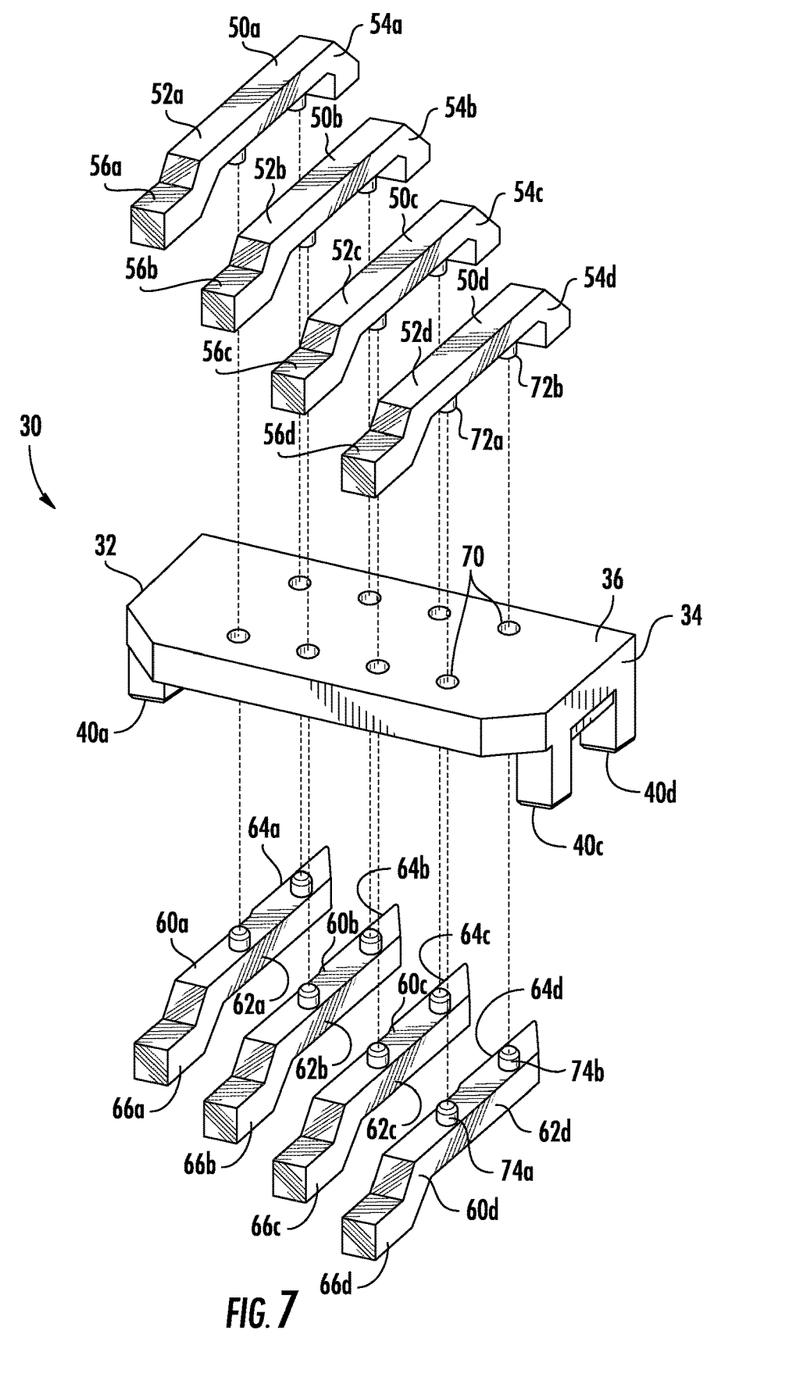
FIG. 7 is an exploded perspective view of the first embodiment of the light pipe array assembly of the subject invention corresponding to the upright orientation shown in FIG. 5, with the light pipes separated from the carrier for ease of illustration.
Figure 8:
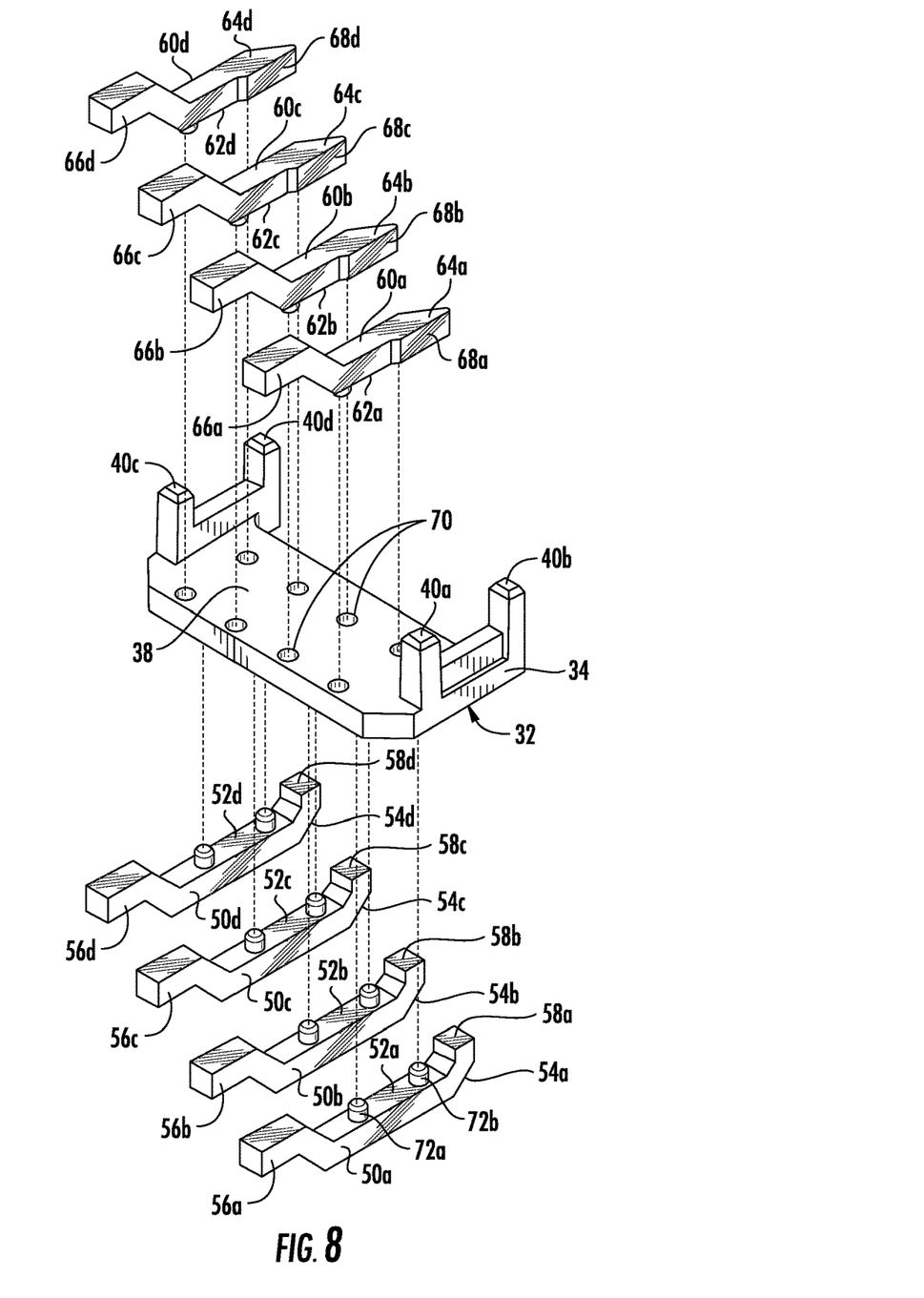
FIG. 8 is an exploded perspective view of the first embodiment of the light pipe array assembly of the subject invention corresponding to the inverted orientation shown in FIG. 6, with the light pipes separated from the carrier for ease of illustration.

Referring now to FIGS. 7 and 8, each light pipe in the first set of light pipes 50a-50d includes a central body portion 52a-52d, a proximal end portion 54a-54d for communicating with an LED 24a-24d and a distal end portion 56a-56b for communicating with a visual display port remote from the LEDs. More particularly, the proximal end portion 54a-54d of each light pipe 50a-50d in the first set of light pipes includes a downwardly facing, horizontal light receiving surface 58a-58d that is adapted and configured to optically communicate with the vertically mounted LEDs 24a-24d extending upwardly from the printed circuit board 20, as shown for example in FIG. 3. Thus, the signals from LEDs 24a-24d will be displayed through ports 18a-18d on the front panel 14 of blade server housing 12

Similarly, each light pipe in the second set of light pipes 60a-60d includes a central body portion 62a-62d, a proximal end portion 64a-64d for communicating with an LEDs 22a-22d and a distal end portion 66a-66b for communicating with a visual display port remote from the LEDs. More particularly, the proximal end portion 64a-64d of each light pipe 60a-60d in the second set of light pipes includes a laterally facing, vertical light receiving surface 68a-68d that is adapted and configured to optically communicate with the horizontally mounted LEDs 22a-22d, mounted on printed circuit board 20, as best seen in FIG. 3.

The platform 34 of the opaque carrier 32 includes a plurality of spaced apart mounting apertures 70 in the upper and lower surfaces 36 and 38 thereof for receiving mounting posts that depends from the central body portion of each light pipe. More particularly, each of the light pipes 50a-50d have a pair of spaced apart mounting post 72a, 72b that depend from the bottom surface of the central body portion 52a-52d of light pipes 50a-50d for reception within the mounting apertures 70 provided in the upper surface 36 of platform 34. Similarly, light pipes 60a-60d have mounting post pairs 74a, 74b extending upwardly from the top surface of the central body portion 62a-62d of light pipes 60a-60d for reception within the mounting apertures 70 provided in the lower surface 38 of platform 34. For purposes of easy assembly, the mounting posts are advantageously press-fit into the mounting apertures. No glue or complex fastening techniques are required for assembly.

It is envisioned that the mounting apertures 70 in the upper and lower surface of the platform 34 can be staggered with respect to one another, to prevent optical cross-talk between the mounting posts of vertically adjacent light pipes in the array. This staggered relationship between vertically adjacent mounting posts is illustrated in the light pipe array assembly 30 shown in FIG. 1.

Figure 9:
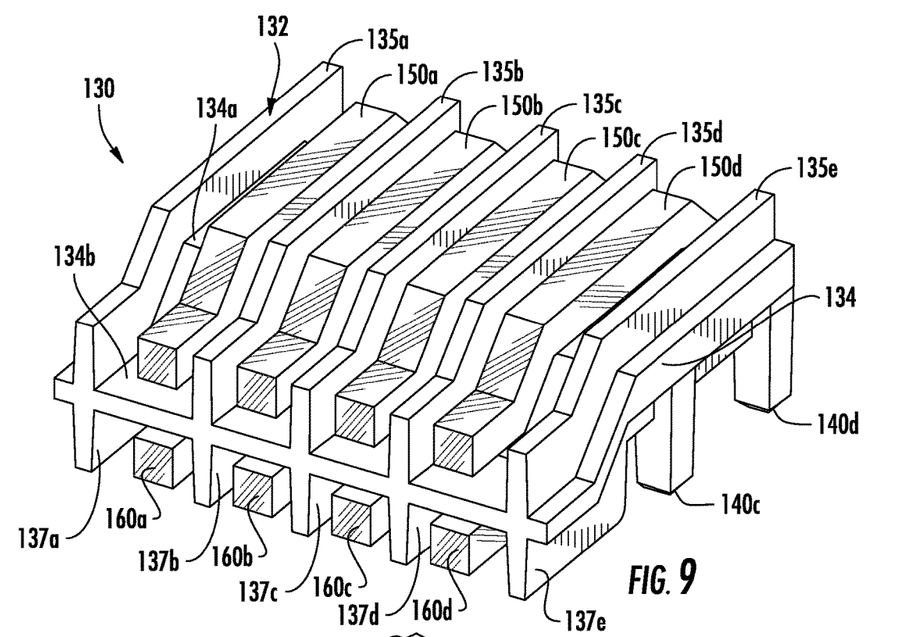
FIG. 9 is a perspective view of a second embodiment of the light pipe array assembly of the subject invention in an upright orientation to illustrate the arrangement of the first set of light pipes on the upper surface of the carrier platform.
Figure 10:
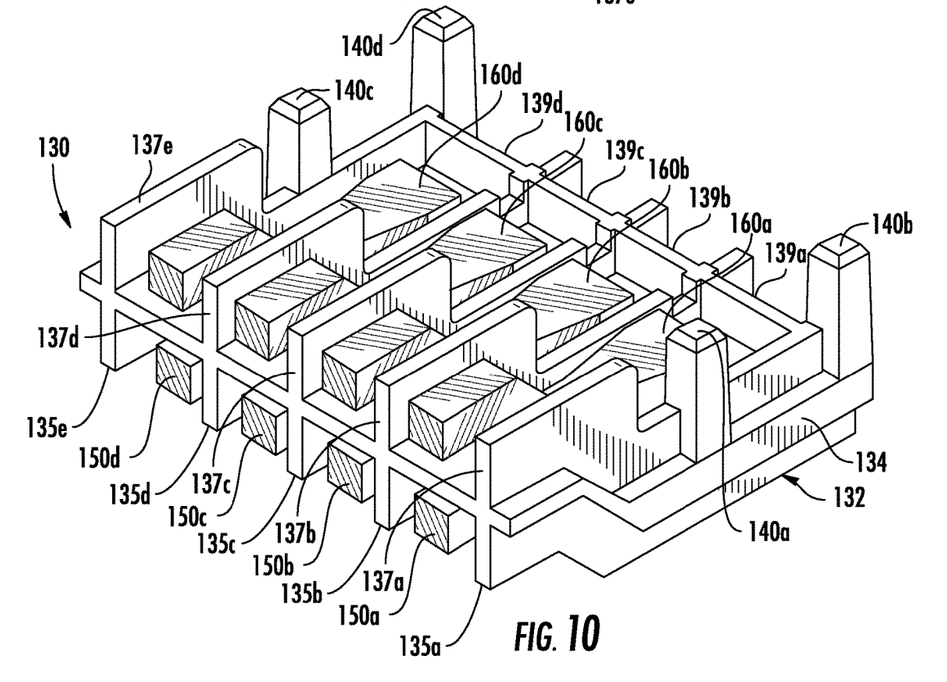
FIG. 10 is a perspective view of the second embodiment of the light pipe array assembly of the subject invention in an inverted orientation to illustrate the arrangement of the second set of light pipes on the lower surface of the carrier platform.
Figure 11:
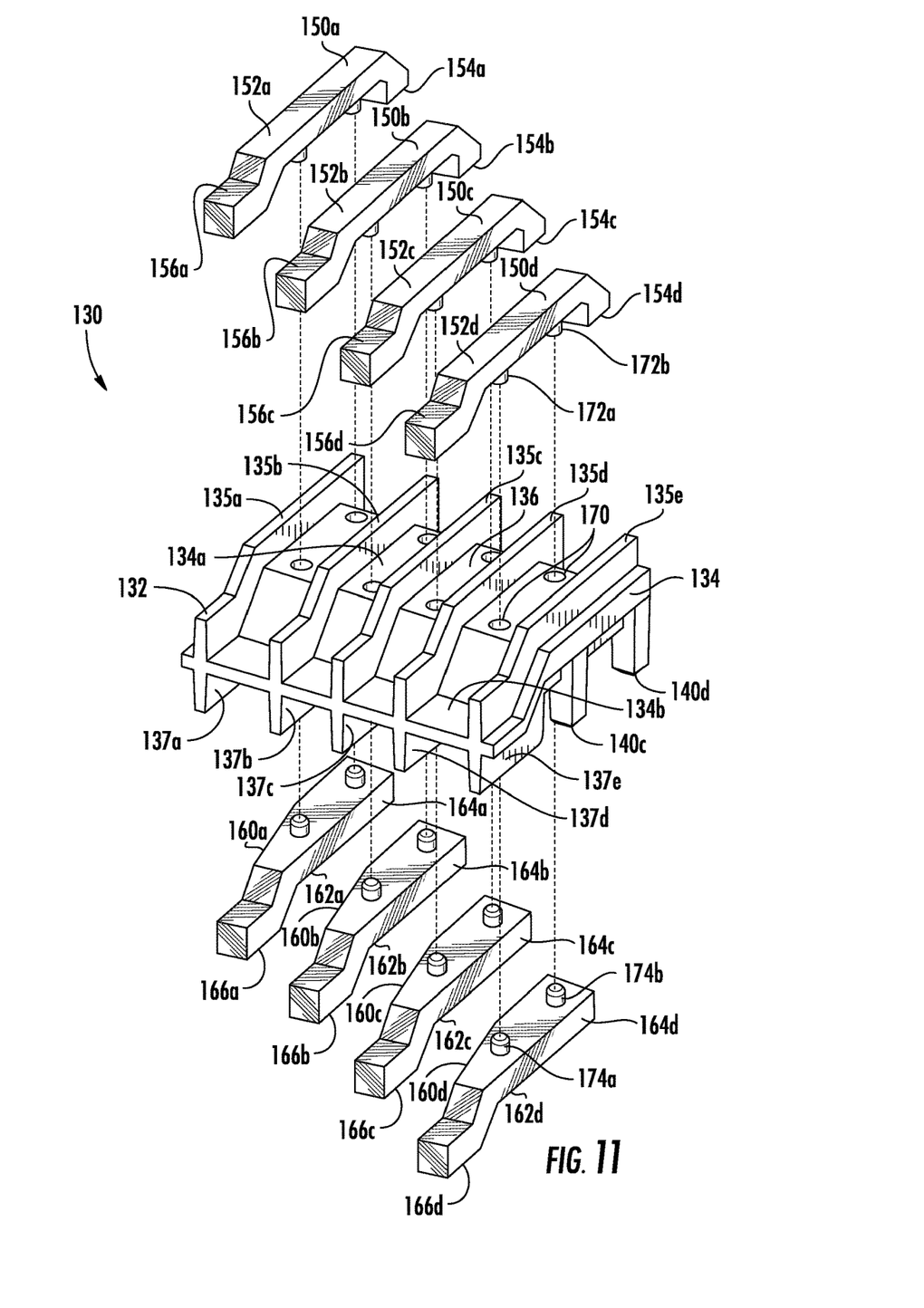
FIG. 11 is an exploded perspective view of the second embodiment of the light pipe array assembly of the subject invention corresponding to the upright orientation shown in FIG. 9, with the light pipes separated from the carrier for ease of illustration.

Referring now to FIGS. 9-11, there is illustrated another embodiment of a light pipe array assembly constructed in accordance with the subject invention, which is designated generally by reference numeral 130. Light pipe array assembly 130 includes an opaque carrier 132 having an elongated platform 134 with four mounting legs 140a-140d that differs from the previously described platform 34 of carrier 32 of array assembly 30. More particularly, the platform 134 of carrier 132 includes a first planar level 134a that is structurally associated with the central body portion and the proximal end portion of each light pipe in the array assembly 130, and a second planar level 134b that is structurally associated with the distal end portion of each light pipe in the array assembly 130.

Furthermore, as best seen in FIGS. 9 and 10, each light pipe in the array assembly 130 extends between a pair of integrally formed upstanding opaque walls that extend perpendicular to the longitudinal axis of the carrier 132. These opaque walls serve to optically separate or otherwise isolate horizontally adjacent light pipes from one another to prevent optical cross-talk there between. More particularly, the upper side 136 of carrier 132 includes spaced apart opaque pipe separator walls 135a-135e, and the lower side 138 of carrier 132 includes spaced apart opaque pipe separator wall 137a-137d. In addition, the carrier 132 includes back walls 139a-139d that are provided on the lower side 138 of carrier 132 for physically and individually separating the LEDs 22a-22d from the LEDs 24a-24d, to prevent optical signal interference there between. Thus, there can be cause for confusion as to which LED is actually being presented on the front display panel 14 of the server housing 12.

Figure 12:
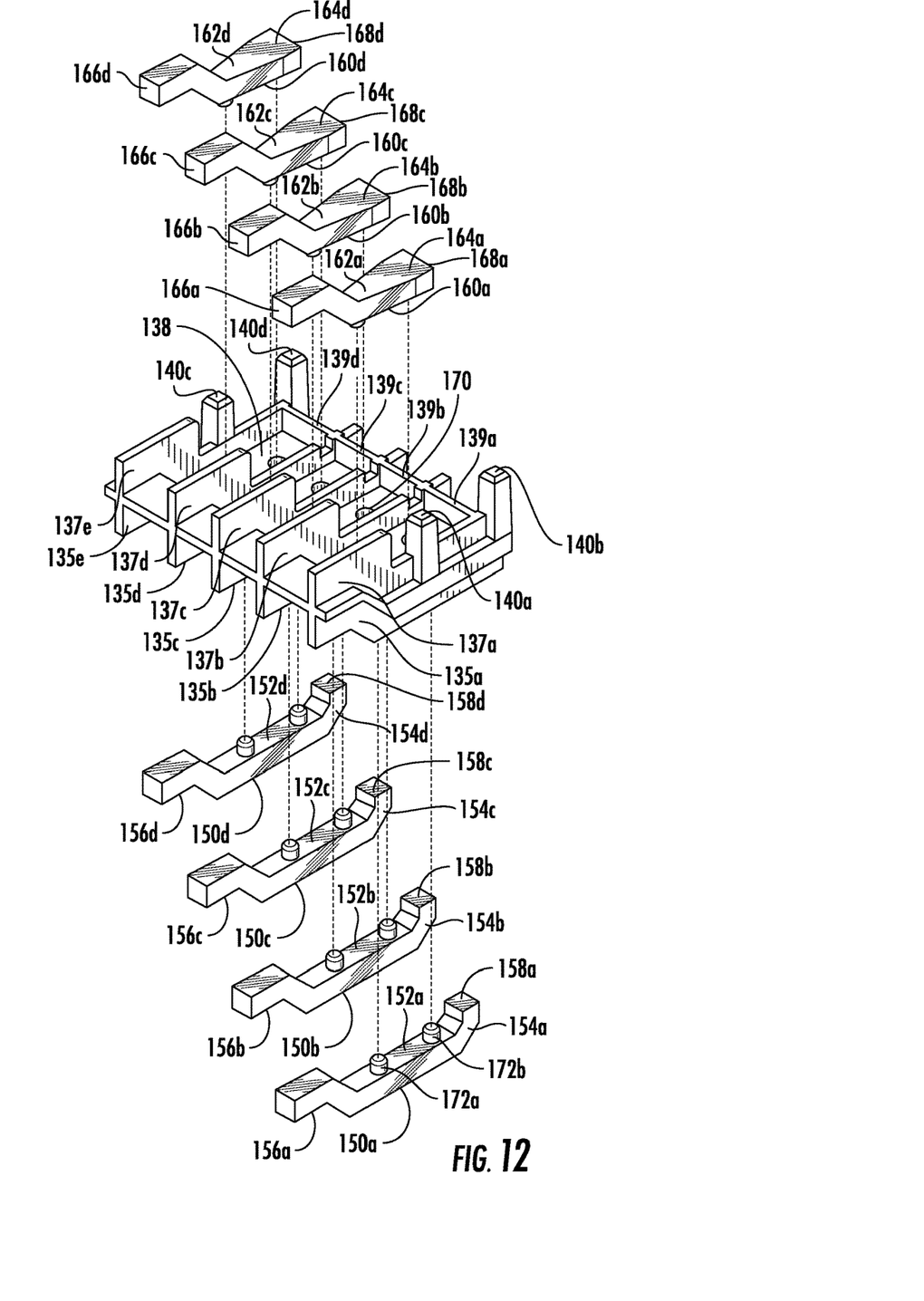
FIG. 12 is an exploded perspective view of the second embodiment of the light pipe array assembly of the subject invention corresponding to the inverted orientation shown in FIG. 10, with the light pipes separated from the carrier for ease of illustration.

Referring to FIGS. 11 and 12, the light pipe array assembly 130 includes a first set of clear plastic light pipes 150a-150d supported on the upper surface 136 of the platform 134 and arranged perpendicular to the longitudinal axis of the platform 134 to transport light from the first set of LEDs 24a-24d on the printed circuit board 20 to the first set of display ports 18a-18d on the front display panel 14 of blade server housing 12.

The assembly 130 also includes a second set of clear plastic light pipes 160a-160d supported on the lower surface 138 of the platform 134 and arranged perpendicular to the longitudinal axis of the platform 134 in alignment with the first set of light pipes 150a-150d to transport light from the second set of LEDs 22a-22d on the printed circuit board 20 to the second set of display ports 16a-16d on the front display panel 14 of the blade server housing 12.

Each light pipe in the first set of light pipes 150a-150d includes a central body portion 152a-152d, a proximal end portion 154a-154d for communicating with an LED 24a-24d and a distal end portion 156a-156d for communicating with a visual display port remote from the LEDs. More particularly, the proximal end portion 154a-154d of each light pipe 150a-150d in the first set of light pipes includes a horizontal light receiving surface 158a-158d for optically communicating with the vertically mounted LEDs 24a-24d shown in FIG. 4.

Similarly, each light pipe in the second set of light pipes 160a-160d includes a central body portion 162a-162d, a proximal end portion 164a-164d for communicating with an LED 22a-22d and a distal end portion 166a-166d for communicating with a visual display port remote from the LEDs. More particularly, the proximal end portion 164a-164d of each light pipe 160a-160d in the second set of light pipes includes a vertical light receiving surface 168a-168d for optically communicating with the horizontally mounted LEDs 22a-22d shown in FIG. 4.

The platform 134 of carrier 132 includes a plurality of spaced apart mounting apertures 170 in the upper and lower surfaces 136 and 138 thereof for receiving mounting posts that depends from the central body portion of each light pipe. More particularly, light pipes 150a-150d have spaced apart mounting post pairs 172a, 172b depending downwardly from the bottom surface of the central body portion 152a-152d of light pipes 150a-150d for reception within the mounting apertures 170 provided in the upper surface 136 of platform 134.

Similarly, light pipes 160a-160d have spaced apart mounting post pairs 174a, 174b extending upwardly from the top surface of the central body portion 162a-162d of light pipes 160a-160d for reception within the mounting apertures 170 provided in the lower surface 138 of platform 134. The mounting apertures 170 in the upper and lower surface of the platform 134 are staggered with respect to one another, to prevent optical cross-talk between the mounting posts of vertically adjacent light pipes in the array.

While the subject invention have been shown and described with reference to preferred embodiments, those skilled in the art will readily appreciate that further changes or modifications may be made to the present invention without departing from the spirit and scope thereof, as defined by the appended claims. For example, while the light pipe array assembly of the subject invention is shown and described with respect to a printed circuit board located within a blade server housing, it is envisioned that the light pipe array assembly of the subject invention can be employed or otherwise incorporated into other device enclosures including, but not limited to, a variety of different computing and telecommunication network peripheral devices.

What is claimed is:

1. A light pipe array assembly comprising:
   a) a carrier having an elongated platform defining upper and lower horizontal surfaces and a longitudinal axis;
   b) a first plurality of light pipes supported on the upper surface of the platform and arranged perpendicular to the longitudinal axis of the platform; and
   c) a second plurality of light pipes supported on the lower surface of the platform and arranged perpendicular to the longitudinal axis of the platform in alignment with the first plurality of light pipes, wherein the first and second pluralities of light pipes are optically isolated from each other by the platform of the carrier.

2. A light pipe array assembly as recited in claim 1, wherein the carrier is constructed from an opaque plastic material.

3. A light pipe array assembly as recited in claim 1, wherein the carrier includes legs depending from the lower surface of the platform for mounting the light pipe array assembly to a supporting structure.

4. A light pipe array assembly as recited in claim 1, wherein each light pipe is formed from a clear plastic material.

5. A light pipe array assembly as recited in claim 1, wherein each light pipe includes a central body portion, a proximal end portion for communicating with a light source and a distal end portion for communicating with a visual display remote from the light source.

6. A light pipe array assembly as recited in claim 5, wherein the proximal end portion of each light pipe in the first plurality of light pipes includes a horizontal light receiving surface for communicating with the light source.

7. A light pipe array assembly as recited in claim 5, wherein the proximal end of each light pipe in the second plurality of light pipes includes a vertical light receiving surface for communicating with the light source.

8. A light pipe array assembly as recited in claim 5, wherein the platform includes a plurality of spaced apart mounting apertures in the upper and lower surfaces thereof for receiving mounting posts depending from the central body portion of each light pipe.

9. A light pipe array assembly as recited in claim 8, wherein the central body portion of each light pipe includes a pair of spaced apart mounting posts.

10. A light pipe array assembly as recited in claim 5, wherein the platform includes a first planar level associated with the central body portion and proximal end portion of each light pipe and a second planar level associated with the distal end portion of each light pipe.

11. A light pipe array assembly as recited in claim 1, wherein each light pipe extends between a pair of upstanding walls formed integral with the platform.

12. A light pipe array assembly mounted to a printed circuit board, comprising:
    a) a carrier having an elongated platform defining upper and lower horizontal surfaces and a longitudinal axis, and including legs depending from the lower surface of the platform for mounting the light pipe array assembly to the printed circuit board;
    b) a first plurality of light pipes supported on the upper surface of the platform and arranged perpendicular to the longitudinal axis of the platform for communicating with a first plurality of light sources on the printed circuit board; and
    c) a second plurality of light pipes supported on the lower surface of the platform and arranged perpendicular to the longitudinal axis of the platform in alignment with the first plurality of light pipes for communicating with a second plurality of light sources on the printed circuit board.

13. A light pipe array assembly mounted to a printed circuit board as recited in claim 12, wherein the carrier is constructed from an opaque plastic material.

14. A light pipe array assembly mounted to a printed circuit board as recited in claim 12, wherein each light pipe includes a central body portion, a proximal end portion for communicating with a light source and a distal end portion for illumination remote from the light source.

15. A light pipe array assembly mounted to a printed circuit board as recited in claim 14, wherein the platform includes a first planar level associated with the central body portion and proximal end portion of each light pipe and a second planar level associated with the distal end portion of each light pipe.

16. A light pipe array assembly mounted to a printed circuit board as recited in claim 14, wherein the proximal end portion of each light pipe in the first plurality of light pipes includes a horizontal light receiving surface for communicating with a light source.

17. A light pipe array assembly mounted to a printed circuit board as recited in claim 16, wherein the proximal end of each light pipe in the second plurality of light pipes includes a vertical light receiving surface for communicating with a light source.

18. A light pipe array assembly mounted to a printed circuit board as recited in claim 16, wherein the platform includes a plurality of spaced apart mounting apertures in the upper and lower surfaces thereof for receiving mounting posts depending from the central body portion of each light pipe.

19. A light pipe array assembly mounted to a printed circuit board as recited in claim 18, wherein the central body portion of each light pipe includes a pair of spaced apart mounting posts.

20. A light pipe array assembly mounted to a printed circuit board as recited in claim 12, wherein each light pipe extends between a pair of upstanding walls formed integral with the platform.

21. A light pipe array assembly mounted to a printed circuit board in a blade server housing, comprising:
   a) a carrier having an elongated planar platform defining upper and lower horizontal surfaces and a longitudinal axis, and including legs depending from the lower surface of the platform for mounting the light pipe array assembly to the printed circuit board;
   b) a first plurality of light pipes supported on the upper surface of the platform and arranged perpendicular to the longitudinal axis of the platform to transport light from a first plurality of light sources on the printed circuit board to a first plurality of ports on a front display panel of the blade server housing; and
   c) a second plurality of light pipes supported on the lower surface of the platform and arranged perpendicular to the longitudinal axis of the platform in alignment with the first plurality of light pipes to transport light from a second plurality of light sources on the printed circuit board to a second plurality of ports on the front display panel of the blade server housing.

22. A light pipe array assembly mounted to a printed circuit board in a blade server housing as recited in claim 21, wherein the carrier is constructed from an opaque plastic material.

23. A light pipe array assembly mounted to a printed circuit board in a blade server housing as recited in claim 21, wherein the platform includes a plurality of spaced apart mounting apertures in the upper and lower surfaces thereof for receiving mounting posts depending from the central body portion of each light pipe.

24. A light pipe array assembly mounted to a printed circuit board in a blade server housing as recited in claim 23, wherein the central body portion of each light pipe includes a pair of spaced apart mounting posts.

\* \* \* \* \*